(12) United States Patent
Wang et al.

(10) Patent No.: US 10,477,689 B2
(45) Date of Patent: Nov. 12, 2019

(54) MANUFACTURING METHOD OF FLEXIBLE ARRAY SUBSTRATE

(71) Applicant: Shenzhen China Star Optoelectronics Technology Co., Ltd., Shenzhen (CN)

(72) Inventors: Gang Wang, Shenzhen (CN); Lixuan Chen, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 224 days.

(21) Appl. No.: 15/503,704

(22) PCT Filed: Dec. 30, 2016

(86) PCT No.: PCT/CN2016/113371
§ 371 (c)(1),
(2) Date: Feb. 13, 2017

(87) PCT Pub. No.: WO2018/113025
PCT Pub. Date: Jun. 28, 2018

(65) Prior Publication Data
US 2018/0213648 A1     Jul. 26, 2018

(30) Foreign Application Priority Data
Dec. 20, 2016    (CN) .......................... 2016 1 1184975

(51) Int. Cl.
*H05K 1/18*      (2006.01)
*G02F 1/1333*   (2006.01)
(Continued)

(52) U.S. Cl.
CPC ....... *H05K 1/189* (2013.01); *G02F 1/133305* (2013.01); *G09F 9/301* (2013.01);
(Continued)

(58) Field of Classification Search
CPC ........ H05K 3/007; H05K 3/28; H05K 1/0281; H05K 1/189; G02F 1/133305; G02F 1/13452; G09F 9/301
See application file for complete search history.

(56) References Cited

U.S. PATENT DOCUMENTS 6,036,809 A *   3/2000   Kelly ..................... B32B 43/00
                                                 156/230
8,367,473 B2 *   2/2013   Huang .................... H01L 24/32
                                                 438/110
(Continued)

*Primary Examiner* — Peter Dungba Vo
*Assistant Examiner* — Jeffrey T Carley
(74) *Attorney, Agent, or Firm* — Leong C. Lei

(57) ABSTRACT

The invention provides a manufacturing method for flexible array substrate. The method comprises: adhering the flexible substrate to the rigid support plate to manufacture the back side driver circuit and the protective layer on the back side driver circuit; peeling the flexible substrate off, turning the flexible substrate over and then adhering again to the rigid supporting plate to manufacture the protecting layer and the adhesive layer; forming holes, front side driver circuit and display circuit on the flexible substrate, the back side driver circuit electrically connected to the display circuit and the back side driver circuit electrically connected to the display circuit through the holes to obtain a flexible array substrate with double-sided circuit structure. By distributing the circuit structure of the non-active area to both sides of flexible substrate, the width of the non-active area is reduced to realize an ultra-narrow border or borderless display.

10 Claims, 6 Drawing Sheets

(51) Int. Cl.
*H05K 1/02* (2006.01)
*H05K 3/28* (2006.01)
*H05K 3/00* (2006.01)
*G09F 9/30* (2006.01)
*G02F 1/1345* (2006.01)
*G02F 1/136* (2006.01)

(52) U.S. Cl.
CPC ........... *H05K 1/0281* (2013.01); *H05K 3/007* (2013.01); *H05K 3/28* (2013.01); *G02F 1/13452* (2013.01); *G02F 2001/13613* (2013.01); *G02F 2201/42* (2013.01)

(56) References Cited

U.S. PATENT DOCUMENTS

| | | | | |
|---|---|---|---|---|
| 8,786,062 | B2* | 7/2014 | Su | H01L 21/6835 257/669 |
| 2006/0012048 | A1* | 1/2006 | Murai | H01L 21/4857 257/758 |
| 2010/0109993 | A1* | 5/2010 | Chang | G02F 1/1345 345/92 |
| 2010/0289132 | A1* | 11/2010 | Huang | H01L 21/4846 257/690 |
| 2010/0314744 | A1* | 12/2010 | Huang | H01L 24/32 257/690 |

* cited by examiner

MANUFACTURING METHOD OF FLEXIBLE ARRAY SUBSTRATE

BACKGROUND OF THE INVENTION

1. Field of the Invention

The present invention relates to the field of display techniques, and in particular to a manufacturing method of flexible array substrate.

2. The Related Arts

As the display technology progresses, the liquid crystal display (LCD) and organic light-emitting diode (OLED) displays are widely used because of the advantages of high display quality, low power-consumption, and thinness, in applications of consumer products, such as mobile phones, TV, PDA, digital cameras, notebook PC and desktop PC, and become the mainstream of the display devices.

Refer to FIG. 1, the current LCD usually comprises: a display panel 100, a source driver chip 200 electrically connected to the upper side of the display panel 100, two gate driver chips 40 electrically connected respectively to the left and right sides of the display panel 100, and a driver circuit board 300 electrically connected to the source driver chip 200 and the gate driver chips 400. The display panel 100 comprises an active area 101, and non-active area 102 surrounding the active area 101. The active area 101 is disposed with a plurality of horizontal scan lines arranged in parallel and with intervals, and a plurality of vertical source lines arranged in parallel and with intervals. The non-active area 102 is disposed with a plurality of wires on array (WOA) 500 arranged in a fan manner. The WOA 500 connects the plurality of scan lines to the gate driver chips 400 and connects the plurality of source lines to the source driver chip 200.

As the display technology progresses, the narrow borders or borderless are becoming a trend. For both LCD and OLED, narrow borders or borderless displays can provide a better experience. However, the unavoidable WOA around the active area of the panel results in a larger distance between the active area and the edge, which makes it harder to achieve borderless or ultra-narrow borders. In particular, when the resolution of a panel increases from HD to ultra-high definition or even higher, more area is required for the WOA, leading to more difficulty in border reduction. Moreover, as the display technology progresses, the gate driver on array (GOA) is used to replace the gate driver chip, wherein the GOA circuit is directly manufactured on the not-active area of the display panel and directly connected to the scan lines. However, the WOA cannot be eliminated as the WOA is needed to electrically connect the driver circuit board to the GOA circuit. As such, although the gate driver chip is eliminated, the GOA circuit still occupies a non-active area with certain width, especially when the resolution of the display panel increases from high definition (HD) to ultra-HD or even higher, the number of stages of GOA circuit will also be higher. As the width of the display panel is fixed, the width of the non-active area must be widened to accommodate more thin film transistors (TFTs) and circuit structure of the GOA circuit. The large area occupied by GOA circuit and WOA routing is a disadvantage for the realization of ultra-narrow border or borderless display.

SUMMARY OF THE INVENTION

The object of the present invention is to provide a manufacturing method of flexible array substrate, able to manufacture a double-sided circuit structure on the flexible substrate to reduce the width of non-active area and achieve ultra-narrow border or borderless display.

To achieve the above object, the present invention provides a manufacturing method of flexible array substrate, which comprises:

Step 1: providing a rigid support plate and a flexible substrate, adhering the flexible substrate to the rigid support plate with an adhesive layer so that a back side of the flexible substrate is facing away from the rigid support plate;

Step 2: forming a back side driver circuit on the back side of the flexible substrate and providing a protective layer on the back side driver circuit;

Step 3: separating the flexible substrate from the rigid support plate, turning the flexible substrate over and adhering the flexible substrate to the rigid support plate with the adhesive layer so that the front side of the flexible substrate is facing away from the rigid support plate, with the protective layer contacting the adhesive layer;

Step 4: forming holes penetrating the flexible substrate in a predefined non-active area on the front side of the flexible substrate, exposing the back side driver circuit on the back side of the flexible substrate;

Step 5: forming a front side driver circuit and a display circuit respectively on the predefined non-active area and an active area on the front side of the flexible substrate, the front side driver circuit being electrically connected to the display circuit, and the back side driver circuit being electrically connected to the display circuit through the holes;

Step 6: separating the flexible substrate from the rigid support plate to obtain the flexile array substrate.

According to a preferred embodiment of the present invention, the rigid support plate is made of glass.

According to a preferred embodiment of the present invention, the material of the flexible substrate is polyimide, polyethylene terephthalate, cycloolefin copolymer, or polyether resin.

According to a preferred embodiment of the present invention, the thickness of the flexible substrate is 10-300 µm.

According to a preferred embodiment of the present invention, in Step 4, the holes are formed by a laser drilling process or a chemistry etching process.

According to a preferred embodiment of the present invention, the diameter of the hole is 5-100 µm.

According to a preferred embodiment of the present invention, in Step 3 and Step 6, the flexible substrate is separated from the rigid support plate by a laser peeling process.

According to a preferred embodiment of the present invention, the adhesive layer is made of a temperature-controlled glue, and in Step 3 and Step 6, separating the flexible substrate from the rigid support plate is by changing the temperature of the adhesive layer.

According to a preferred embodiment of the present invention, the front side driver circuit and the back side driver circuit together form the wire on array (WOA) of the flexible array substrate.

According to a preferred embodiment of the present invention, the front side driver circuit and the back side driver circuit together form the wire on array (WOA) and the gate driver on array (GOA) circuit of the flexible array substrate.

Another embodiment of the present invention provides a manufacturing method of flexible array substrate, which comprises:

Step 1: providing a rigid support plate and a flexible substrate, adhering the flexible substrate to the rigid support plate with an adhesive layer so that the back side of the flexible substrate facing away from the rigid support plate;

Step 2: forming a back side driver circuit on the back side of the flexible substrate and covering a protective layer on the back side driver circuit;

Step 3: separating the flexible substrate from the rigid support plate, turning the flexible substrate over and adhering the flexible substrate to the rigid support plate with the adhesive layer so that the front side of the flexible substrate facing away from the rigid support plate, with the protective layer contacting the adhesive layer;

Step 4: forming holes penetrating the flexible substrate in a predefined non-active area on the front side of the flexible substrate, exposing the back side driver circuit on the back side of the flexible substrate;

Step 5: forming a front side driver circuit and a display circuit respectively on the predefined non-active area and active area on the front side of the flexible substrate, the front side driver circuit being electrically connected to the display circuit, and the back side driver circuit being electrically connected to the display circuit through the holes;

Step 6: separating the flexible substrate from the rigid support plate to obtain the flexile array substrate;

wherein the rigid support plate being made of glass;

wherein the material of the flexible substrate being polyimide, polyethylene terephthalate, cycloolefin copolymer, or polyether resin;

wherein the thickness of the flexible substrate is 10-300 μm.

Compared to the known techniques, the present invention provides the following advantages. The present invention provides a manufacturing method of flexible array substrate. The method comprises: adhering the flexible substrate to the rigid support plate to manufacture the back side driver circuit and the protective layer on the back side driver circuit; peeling the flexible substrate off, turning the flexible substrate over and then adhering again to the rigid supporting plate to manufacture the protecting layer and the adhesive layer; forming holes, front side driver circuit and display circuit on the flexible substrate, the back side driver circuit electrically connected to the display circuit and the back side driver circuit electrically connected to the display circuit through the holes to obtain a flexible array substrate with double-sided circuit structure. By distributing the circuit structure of the non-active area to both sides of the flexible substrate, the width of the non-active area can be reduced to realize an ultra-narrow border or borderless display.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
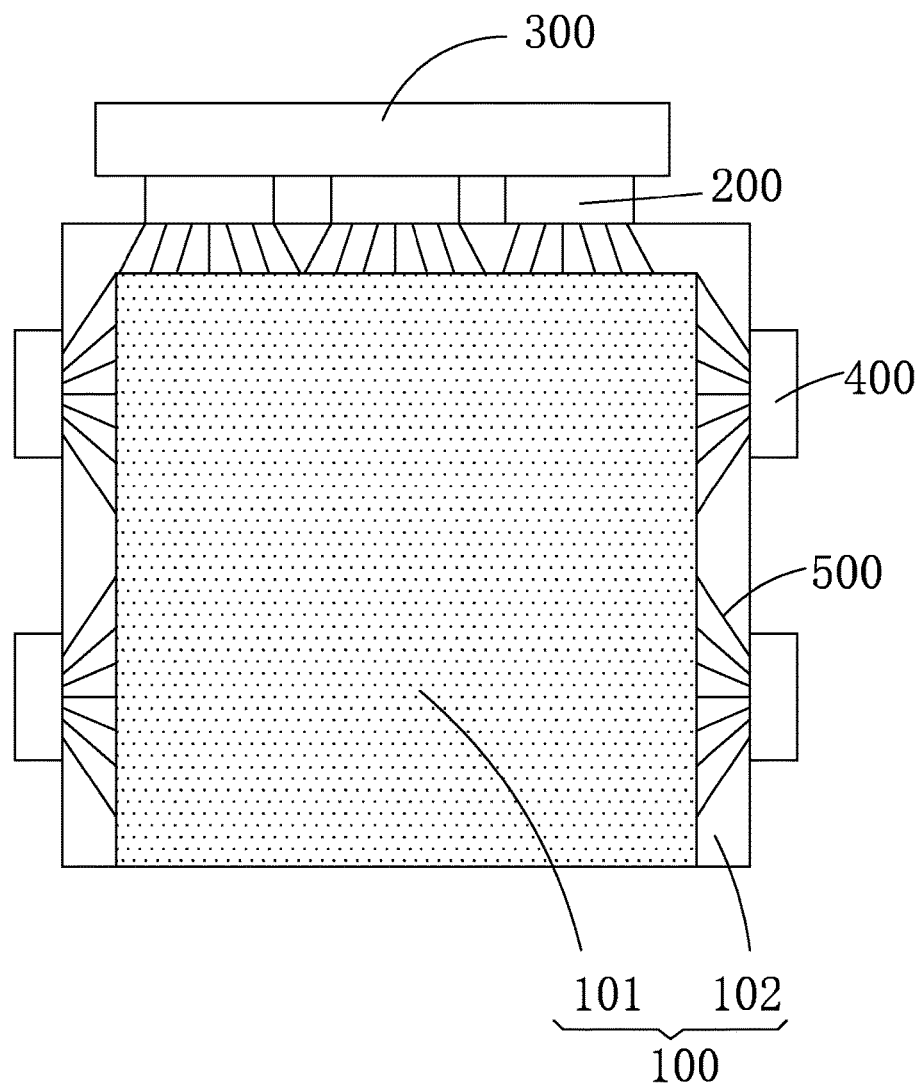
FIG. 1 is a schematic view showing a structure of known liquid crystal display (LCD) device.
Figure 2:
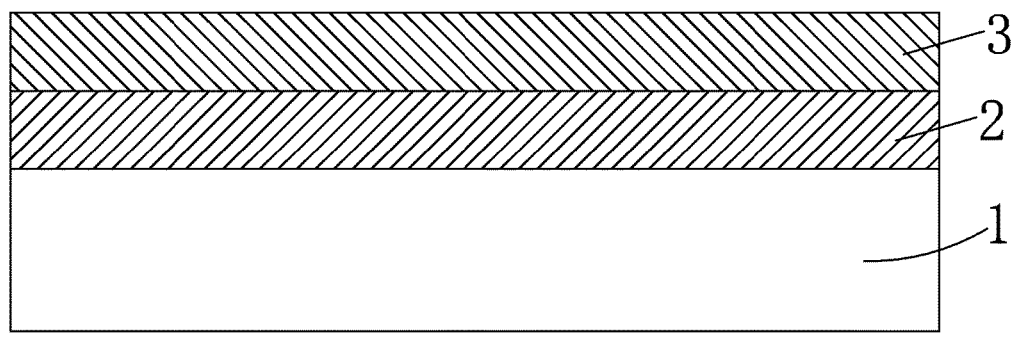
FIG. 2 is a schematic view showing Step 1 of the manufacturing method of flexible array substrate provided by the first embodiment of the present invention.
Figure 9:
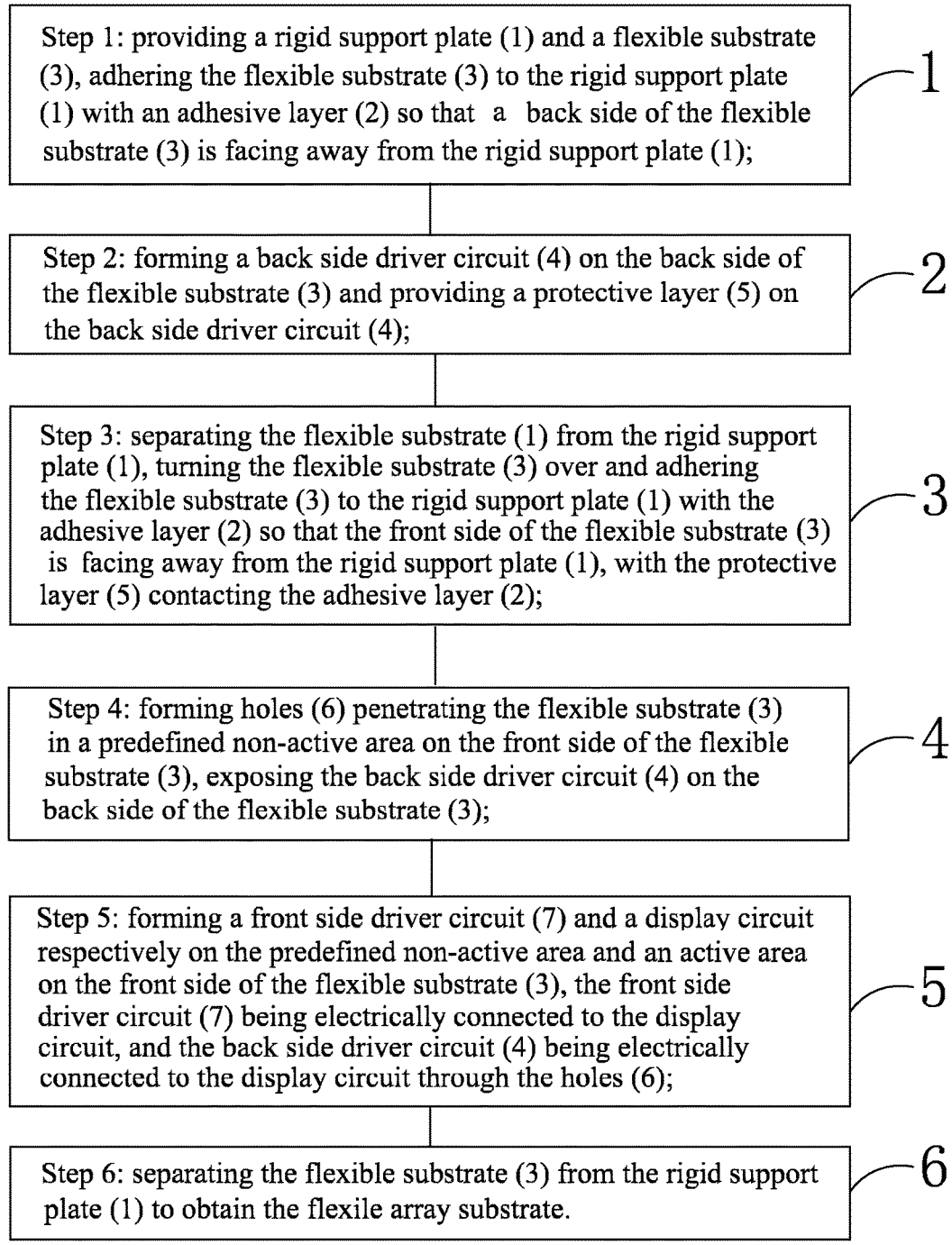
FIG. 9 is a schematic view showing the flowchart of the manufacturing method of flexible array substrate provided by the first embodiment of the present invention.

Referring to FIG. 9, the present invention provides a manufacturing method of flexible array substrate, which comprises:

Step 1: referring to FIG. 2, providing a rigid support plate 1 and a flexible substrate 3, adhering the flexible substrate 3 to the rigid support plate 1 with an adhesive layer 2 so that the back side of the flexible substrate 3 is facing away from the rigid support plate 1.

Specifically, the rigid support plate 1 is made of glass; the material of the flexible substrate 3 is polyimide (PI), polyethylene terephthalate (PET), cycloolefin copolymer (COC), or polyether resin (PES); the thickness of the flexible substrate is 10-300 μm, which facilitates the subsequent drilling of holes. The adhesive layer 2 can be made of pressure-sensitive glue or temperature-controlled glue.

Figure 3:
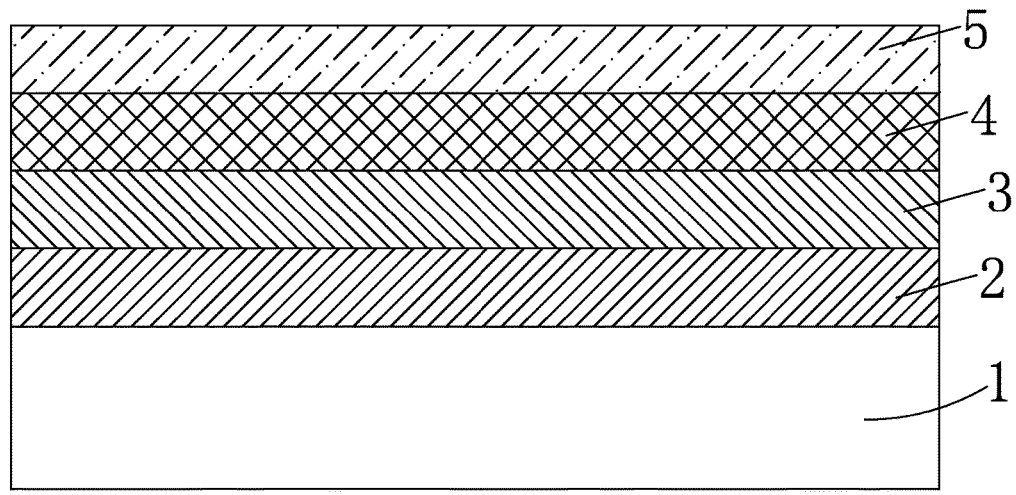
FIG. 3 is a schematic view showing Step 2 of the manufacturing method of flexible array substrate provided by the first embodiment of the present invention.

Step 2: referring to FIG. 3, forming a back side driver circuit 4 on the back side of the flexible substrate 3 and providing a protective layer 5 on the back side driver circuit 4.

Specifically, the protective layer 5 is made with an inorganic oxide deposition process or an organic material coating process.

Figure 4:
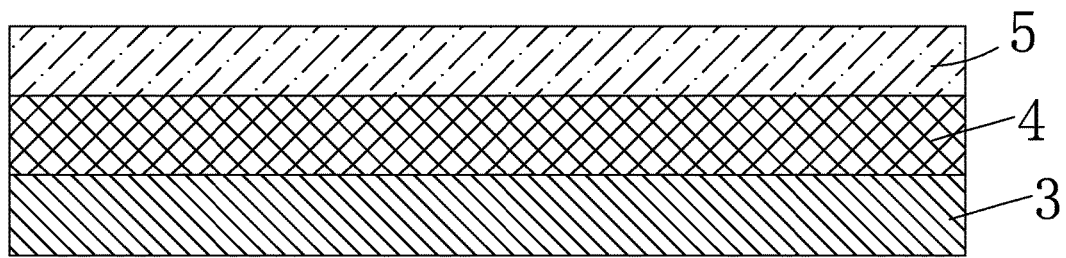
FIG. 4 and FIG. 5 are schematic views showing Step 3 of the manufacturing method of flexible array substrate provided by the first embodiment of the present invention.
Figure 5:
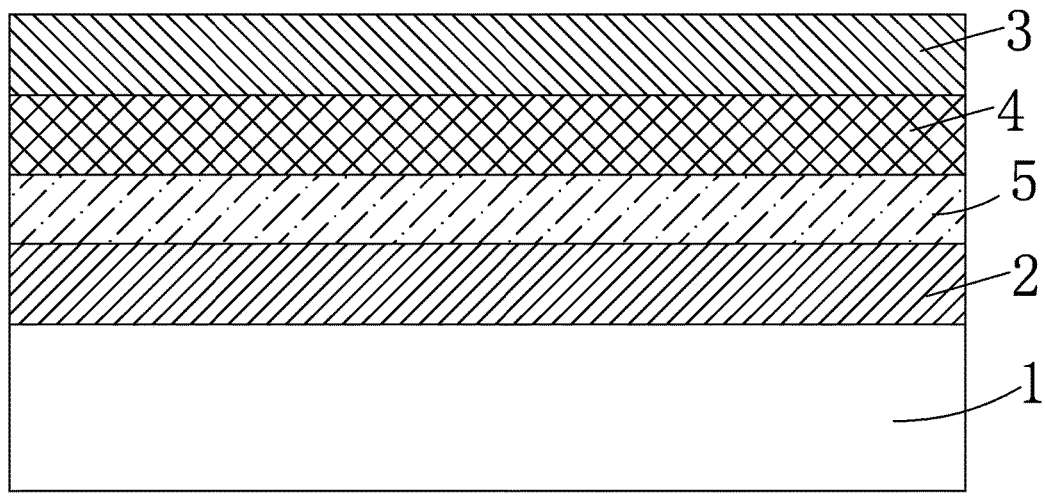

Step 3: referring to FIG. 4, separating the flexible substrate 3 from the rigid support plate 1, turning the flexible substrate 3 over and adhering the flexible substrate 3 to the rigid support plate 1 with the adhesive layer 2 so that the front side of the flexible substrate 3 is facing away from the rigid support plate 1, with the protective layer 5 contacting the adhesive layer 2.

Specifically, in Step 3, the flexible substrate 3 is separated from the rigid support plate 1 by a laser peeling process. Alternatively, the adhesive layer 2 is made of a temperature-controlled glue, and separating the flexible substrate 3 from the rigid support plate 1 is by changing the temperature of the adhesive layer 2.

Figure 6:
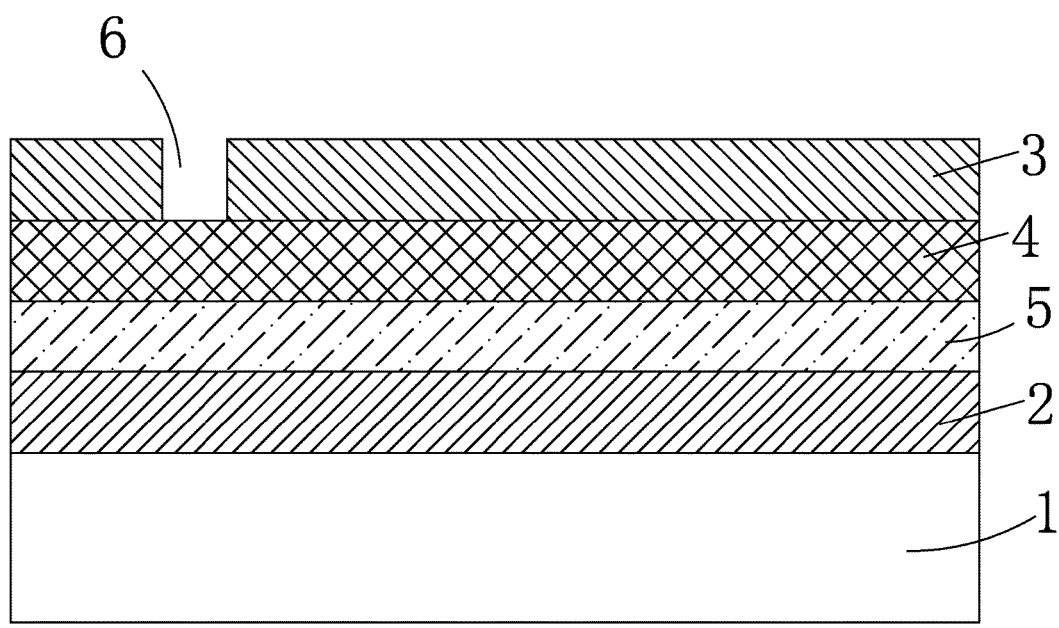
FIG. 6 is a schematic view showing Step 4 of the manufacturing method of flexible array substrate provided by the first embodiment of the present invention.

Step 4: referring to FIG. 6, forming holes 6 penetrating the flexible substrate 3 in a predefined non-active area on the front side of the flexible substrate 3, exposing the back side driver circuit 4 on the back side of the flexible substrate 3.

Specifically, in Step 4, the holes 6 are formed by a laser drilling process or a chemistry etching process. The diameter of the holes must match the diameter of the wires to be passing through the holes 6; and preferably, the diameter of the hole is 5-100 μm.

Figure 7:
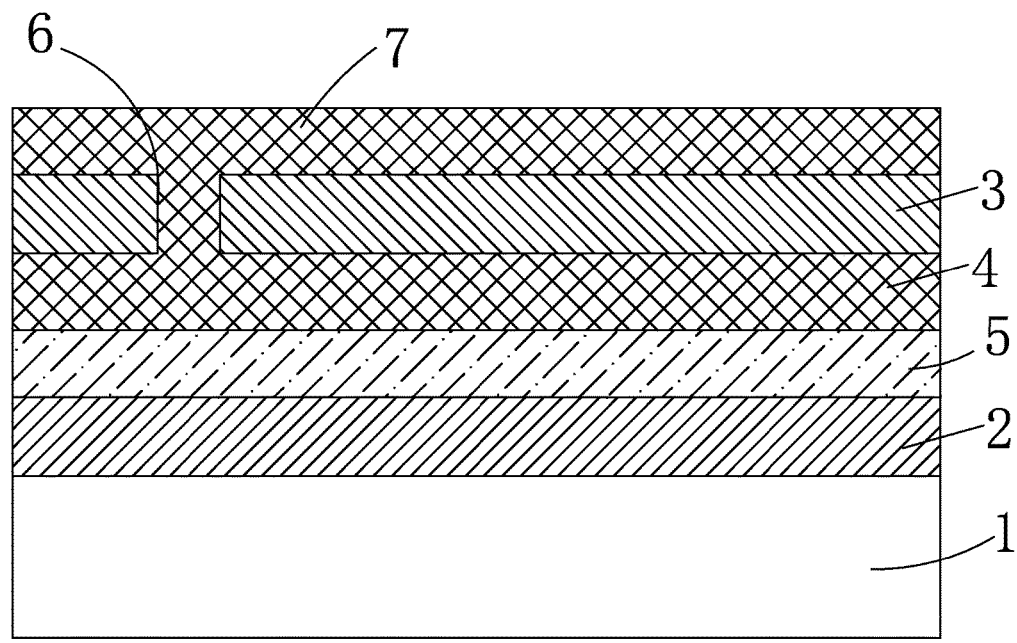
FIG. 7 is a schematic view showing Step 5 of the manufacturing method of flexible array substrate provided by the first embodiment of the present invention.
Figure 8:
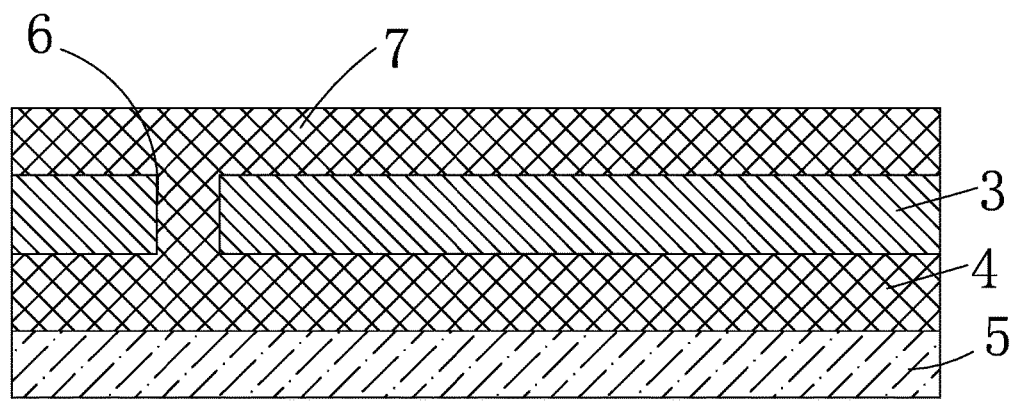
FIG. 8 is a schematic view showing Step 6 of the manufacturing method of flexible array substrate provided by the first embodiment of the present invention.

Step 5: referring to FIG. 7, forming a front side driver circuit 7 and a display circuit respectively on the predefined non-active area and an active area on the front side of the flexible substrate 3, the front side driver circuit 7 being electrically connected to the display circuit, and the back side driver circuit 4 being electrically connected to the display circuit through the holes 6.

Specifically, because the thickness of the flexible substrate 3 is much reduced than the thickness of the known glass substrate, the yield rate of Step 4 of forming holes 6 and Step 5 of forming wires to connect the back side driver circuit 4 to the display circuit in the holes 6 can be ensured so that the process can proceed.

Specifically, the active area is located at the center of the flexible substrate 3, and the non-active area surrounding the active area. The front side driver circuit 7 and the back side driver circuit 4 together form the wire on array (WOA) of the flexible array substrate. The display circuit comprises a plurality of data lines and a plurality of scan lines; the data lines and the scan lines intersect perpendicularly to form a plurality of pixel units. Each wire of the WOA corresponds to a data line or a scan line. Each wire receives a scan signal or data signal externally and transports to the corresponding scan line or data line to achieve displaying.

It should be noted that the present invention is also applicable to array substrate using GOA technology. At this point, the front side driver circuit 7 and the back side driver circuit 4 together form the wire on array (WOA) and the gate driver on array (GOA) circuit of the flexible array substrate. The GOA circuit comprises a plurality of GOA units, with each corresponding to a scan line. Each wire of WOA is electrically connected to a data line or a GOA unit. Each wire passes the received external signal to the GOA unit to generate a scan signal, which is passed to the scan line, or receives a data line and passes to a data line to achieve displaying. The GOA technology eliminates the need for external gate driver chip to further reduce the border width of the display.

It should be noted that by distributing the circuit structure in the non-active area (comprising WOA and GOA) to both sides of the flexible substrate can greatly reduce the area in the non-active area occupied by the circuit structure compared to placing only on one side of the flexible substrate. As such, the width of the non-active area is reduced to achieve ultra-narrow border or borderless display.

Step 6: separating the flexible substrate 3 from the rigid support plate 1 to obtain the flexile array substrate.

Specifically, in Step 6, the flexible substrate 3 is separated from the rigid support plate 1 by a laser peeling process. Alternatively, the adhesive layer 2 is made of a temperature-controlled glue, and separating the flexible substrate 3 from the rigid support plate 1 is by changing the temperature of the adhesive layer 2.

In summary, the present invention provides a manufacturing method of flexible array substrate. The method comprises: adhering the flexible substrate to the rigid support plate to manufacture the back side driver circuit and the protective layer on the back side driver circuit; peeling the flexible substrate off, turning the flexible substrate over and then adhering again to the rigid supporting plate to manufacture the protecting layer and the adhesive layer; forming holes, front side driver circuit and display circuit on the flexible substrate, the back side driver circuit electrically connected to the display circuit and the back side driver circuit electrically connected to the display circuit through the holes to obtain a flexible array substrate with double-sided circuit structure. By distributing the circuit structure of the non-active area to both sides of the flexible substrate, the width of the non-active area can be reduced to realize an ultra-narrow border or borderless display.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method of flexible array substrate, which comprises:
   Step 1: providing a rigid support plate and a flexible substrate, adhering the flexible substrate to the rigid support plate with an adhesive layer so that a back side of the flexible substrate is facing away from the rigid support plate;
   Step 2: forming a back side driver circuit on the back side of the flexible substrate and providing a protective layer on the back side driver circuit;
   Step 3: separating the flexible substrate from the rigid support plate, turning the flexible substrate over and adhering the flexible substrate to the rigid support plate with the adhesive layer so that a front side of the flexible substrate is facing away from the rigid support plate, with the protective layer contacting the adhesive layer;
   Step 4: forming holes penetrating the flexible substrate in a predefined non-active area on the front side of the flexible substrate, exposing the back side driver circuit on the back side of the flexible substrate;
   Step 5: forming a front side driver circuit and a display circuit respectively on the predefined non-active area and an active area on the front side of the flexible substrate, the front side driver circuit being electrically connected to the display circuit, and the back side driver circuit being electrically connected to the display circuit through the holes;
   Step 6: separating the flexible substrate from the rigid support plate to obtain the flexile array substrate.

2. The manufacturing method of flexible array substrate as claimed in claim 1, wherein the rigid support plate is made of glass.

3. The manufacturing method of flexible array substrate as claimed in claim 1, wherein the material of the flexible substrate is polyimide, polyethylene terephthalate, cycloolefin copolymer, or polyether resin.

4. The manufacturing method of flexible array substrate as claimed in claim 1, wherein the thickness of the flexible substrate is 10-300 μm.

5. The manufacturing method of flexible array substrate as claimed in claim 1, wherein in Step 4, the holes are formed by a laser drilling process or a chemistry etching process.

6. The manufacturing method of flexible array substrate as claimed in claim 1, wherein the diameter of the hole is 5-100 μm.

7. The manufacturing method of flexible array substrate as claimed in claim 1, wherein in Step 3 and Step 6, the flexible substrate is separated from the rigid support plate by a laser peeling process.

8. The manufacturing method of flexible array substrate as claimed in claim 1, wherein the adhesive layer is made of a temperature-controlled glue, and in Step 3 and Step 6, separating the flexible substrate from the rigid support plate is by changing the temperature of the adhesive layer.

9. The manufacturing method of flexible array substrate as claimed in claim 1, wherein the front side driver circuit and the back side driver circuit together form a wire on array (WOA) of the flexible array substrate.

10. The manufacturing method of flexible array substrate as claimed in claim 1, wherein the front side driver circuit and the back side driver circuit together form a wire on array (WOA) and a gate driver on array (GOA) circuit of the flexible array substrate.

* * * * *